(12) United States Patent
Ioannou et al.

(10) Patent No.: US 10,170,195 B1
(45) Date of Patent: Jan. 1, 2019

(54) THRESHOLD VOLTAGE SHIFTING AT A LOWER BIT ERROR RATE BY INTELLIGENTLY PERFORMING DUMMY CONFIGURATION READS

(71) Applicant: INTERNATIONAL BUSINESS MACHINES CORPORATION, Armonk, NY (US)

(72) Inventors: Nikolas Ioannou, Zurich (CH); Nikolaos Papandreou, Thalwil (CH); Roman A. Pletka, Zurich (CH); Sasa Tomic, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/833,720

(22) Filed: Dec. 6, 2017

(51) Int. Cl.
*G11C 16/34* (2006.01)
*G11C 16/26* (2006.01)

(52) U.S. Cl.
CPC .......... *G11C 16/3427* (2013.01); *G11C 16/26* (2013.01); *G11C 16/3404* (2013.01); *G11C 16/3418* (2013.01)

(58) Field of Classification Search
CPC ................................................. G11C 16/3404
USPC .................................................... 365/185.24
See application file for complete search history.

(56) References Cited

U.S. PATENT DOCUMENTS

| | | | | |
|---|---|---|---|---|
| 8,539,311 | B2* | 9/2013 | Steiner | G06F 11/1072 714/764 |
| 9,135,109 | B2* | 9/2015 | Ghaly | G01R 31/3171 |
| 9,251,909 | B1 | 2/2016 | Camp et al. | |
| 9,275,740 | B2* | 3/2016 | Huang | G11C 16/10 |
| 9,348,748 | B2 | 5/2016 | Chang et al. | |
| 2013/0194865 | A1 | 8/2013 | Bandic et al. | |
| 2016/0110248 | A1 | 4/2016 | Camp et al. | |

OTHER PUBLICATIONS

Gregori et al.. "On-Chip Error Correcting Techniques for New-Generation Flash Memories" Proceedings of the IEEE, vol. 91, No. 4, Apr. 2003 (Background).
Pan et al., "Exploiting Memory DeviceWear-Out Dynamics to Improve NAND Flash Memory System Performance", FAST, 2011—usenix.org (Background).

(Continued)

*Primary Examiner* — Son Mai
(74) *Attorney, Agent, or Firm* — Brian J. Russell; Jason Sosa (57) ABSTRACT

A controller adapts read voltage thresholds of a non-volatile memory. In one embodiment, in response to selection of a block for adaptation of at least one read voltage threshold applicable to a physical page of the block, the controller issues a dummy read operation to the block to ensure the physical page is in a lower bit error rate (BER) state. The controller waits for a calibration read wait period following the dummy configuration read operation and, during the calibration read wait period, monitors for an interfering access to the non-volatile memory that would temporarily place the physical page in a higher BER state. In response to not detecting the interfering access during the calibration read wait period, the controller performs a calibration read operation for the physical page and adapts at least one read voltage threshold for the physical page based on results of the calibration read operation.

20 Claims, 8 Drawing Sheets

(56) References Cited

OTHER PUBLICATIONS

Mielke et al., "Recovery Effects in the Distributed Cycling of Flash Memories," in Proc. of IEEE International Reliability Physics Symposium, 2006, pp. 29-35. (Related).

Chang et al., "On Trading Wear-leveling with Heal-leveling", DAC '14, Jun. 1-5, 2014, San Francisco, CA, USA (Background).

Chang et al., "Relieving Self-Healing SSDs of Heal Storms" SYSTOR 2017, May 22-24, 2017, Haifa, Israel (Background).

* cited by examiner

THRESHOLD VOLTAGE SHIFTING AT A LOWER BIT ERROR RATE BY INTELLIGENTLY PERFORMING DUMMY CONFIGURATION READS

BACKGROUND OF THE INVENTION

This disclosure relates to data processing and data storage, and more specifically, to determining a threshold voltage shift (TVS) of a read threshold voltage for a unit of data storage in a non-volatile memory system. Still more particularly, the disclosure relates to determining the TVS of the unit of data storage at a lower bit error rate (BER) by intelligently applying a mitigation strategy, which may include performing a dummy configuration read and performing a configuration read within a time window following the dummy configuration read.

NAND flash memory is an electrically programmable and erasable non-volatile memory technology that stores one or more bits of data per memory cell as a charge on the floating gate of a transistor or a similar charge trap structure. The amount of charge on the floating gate modulates the threshold voltage of the transistor. By applying a proper read voltage and measuring the amount of current, the programmed threshold voltage of the memory cell can be determined, and thus the stored information can be detected. Memories storing one, two, three and four bits per cell are respectively referred to in the art as Single Level Cell (SLC), Multi-Level Cell (MLC), Three Level Cell (TLC), and Quad Level Cell (QLC) memories. In a typical implementation, a NAND flash memory array includes multiple physical die, which can each include multiple planes. These planes in turn each contain multiple blocks (also referred to as "erase blocks") of physical memory, each of which includes multiple physical pages each containing a multiplicity of memory cells. By virtue of the physical arrangement of the word and bit lines utilized to access memory cells, flash memory arrays have generally been programmed on a page basis, but erased on a block basis.

In multi-level (i.e., MLC, TLC and QLC) NAND flash memory, information is stored by programming the memory cells to various quantized threshold voltage levels according to the device's programming algorithm, which maps the binary bit values to discrete threshold voltage levels. In response to a page read command, the binary bit values are retrieved by applying appropriate read voltages that divide the programmed threshold voltage window into discrete regimes and by then applying a reverse mapping between the detected threshold voltage levels and the corresponding binary bit values. Over the lifetime of a multi-level NAND flash memory device, the distributions of programmed threshold voltage generally become degraded due to effects such as wear or retention on the memory cells. Consequently, it is generally desirable to adapt or shift the read voltage thresholds defining the various bit values over time to compensate for these effects and to extend the useful life of the NAND memory device.

BRIEF SUMMARY

In general, the effects of wear on a physical page of memory are manifested through an increase in the bit error rate (BER) observed for the physical page over time. As indicated above, the BER of the physical page can be improved by applying appropriate threshold voltage shift (TVS) for the read voltage threshold(s) of the physical page, where the amount of each TVS is based on what TVS value minimizes the BER, compared to reading with nominal TVS values. By adapting read voltage thresholds in this manner, performance and device longevity are both improved.

The present application appreciates that some newer non-volatile memory technologies may have transient operating states in which a physical page of memory may exhibit a temporarily elevated BER. For example, a physical page of three-dimensional (3D) NAND flash memory may experience effects from static electric charge build up when a block is not read for a certain amount of time resulting in a temporarily elevated BER. Hence, when the physical page is first read after a relatively short (e.g., on the order of several minutes) time interval elapses without a read being made to the block containing that physical page, the measured BER may be higher than another read to the same page under different conditions where reads to the block containing the page occurred recently. This higher BER not only falsifies the observed wear, but may result in a situation where the ECC cannot correct the large number of errors. After a read is made to the block containing the physical page, the physical page then abruptly returns to a lower BER. A physical page of 3D NAND flash memory also exhibits a temporarily elevated BER when the physical page is first read following multiple consecutive block erases in the same plane without any intervening read. Again, the elevated BER attributable to this type of interference can be mitigated by performing a read to the block containing the physical page. An operating state of a physical page (or other memory unit) exhibiting only temporarily elevated BER is referred to herein as a Higher BER State (HBS). In a typical operating scenario, after reading one or more pages from a block in a HBS and waiting for some finite amount of time (e.g., 100 ms to seconds), the block (and the physical pages it contains) transitions from the FIBS into a Lower BER State (LBS) in which the observed BER accurately reflects the effects of wear on the block.

The present application thus appreciates that in order for a threshold voltage shift to appropriately compensate for the effects of wear and data retention, it is desirable for the threshold voltage shift to be determined based on the BER observed when a memory unit (e.g., a physical page) is in a LBS rather than a HBS.

In at least one embodiment, in response to selection of a block for adaptation of at least one read voltage threshold applicable to a physical page of the block, a controller issues a dummy read operation to the block to ensure the physical page is in a LBS. The controller waits for a calibration read wait period following the dummy read operation and, during the calibration read wait period, monitors for an interfering access to the non-volatile memory that would temporarily place the physical page in a HBS. In response to not detecting the interfering access during the calibration read wait period, the controller performs a calibration read operation for the physical page and adapts at least one read voltage threshold for the physical page based on results (e.g., an observed BER) of the calibration read operation.

DETAILED DESCRIPTION

In at least one embodiment, a threshold voltage shift (TVS) for at least one read voltage threshold of one or more physical pages of a non-volatile memory is determined based on the bit error rate (BER) of a physical page in a lower BER state (LBS). The physical page is ensured to be in the LBS rather than in a temporary higher BER state (HBS) by controlling the timing of calibration reads (from which the BER of the physical page is determined) relative to page programming operations, page read operations, and interfering operations that may cause the physical page to transition to the FIBS (e.g., block erase operations in the same memory plane). To mitigate or to avoid the transition to FIBS, at the beginning of TVS calibration at least one dummy read is made, which is sufficient to transition the block containing the physical page from the HBS to the LBS. To mitigate or to avoid the transition to the HBS during a calibration because of too long read pauses the calibration read frequency is chosen appropriately. To mitigate or to avoid undesired transitions to the FIBS due to interfering operations such as block erasures on the same plane as the physical page, a block erase count for the plane is maintained during block calibration. If sufficient block erasures to cause a transition from the LBS to the HBS have been made to the plane since the last calibration read, then another dummy read to the block is made prior to making a subsequent calibration read.

Figure 1A:
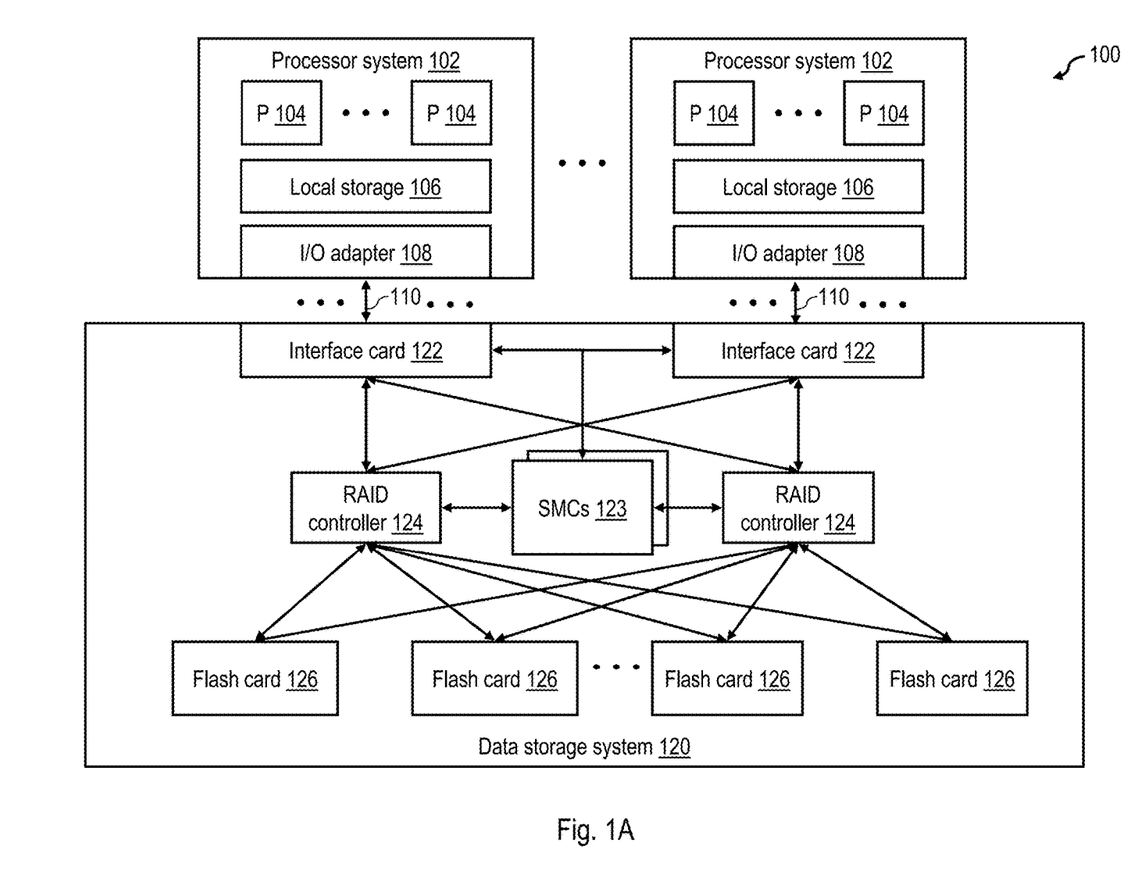
FIG. 1A is a high level block diagram of a data processing environment in accordance with one embodiment.

With reference to the figures and with particular reference to FIG. 1A, there is illustrated a high level block diagram of an exemplary data processing environment 100 including a data storage system 120 having a non-volatile memory array as described further herein. As shown, data processing environment 100 includes one or more hosts, such as a processor system 102 having one or more processors 104 that process instructions and data. A processor system 102 may additionally include local storage 106 (e.g., dynamic random access memory (DRAM) or disks) that may store program code, operands and/or execution results of the processing performed by processor(s) 104. In various embodiments, a processor system 102 can be, for example, a mobile computing device (such as a smartphone or tablet), a laptop or desktop personal computer system, a server computer system (such as one of the POWER series of servers available from International Business Machines Corporation), or a mainframe computer system. A processor system 102 can also be an embedded processor system using various processors such as ARM, PowerPC, Intel X86, or any other processor combined with memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In some embodiments, data storage system 120 may be integral to a processor system 102. In various embodiments, I/O channel 110 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), etc. I/O operations (operations) communicated via I/O channel 110 include read operations by which a processor system 102 requests data from data storage system 120 and write operations by which a processor system 102 requests storage of data in data storage system 120.

Although not required, in the illustrated embodiment, data storage system 120 includes multiple interface cards 122 through which data storage system 120 receives and responds to input/output operations (operation) of hosts via I/O channels 110. Each interface card 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to non-volatile storage media, which in the illustrated example include multiple flash cards 126 bearing NAND flash memory. In other embodiments, alternative and/or additional non-volatile storage devices can be employed.

In the depicted embodiment, the operation of data storage system 120 is managed by redundant system management controllers (SMCs) 123, which are coupled to interface cards 122 and RAID controllers 124. In various embodiments, system management controller 123 can be implemented utilizing hardware or hardware executing firmware and/or software.

Figure 1B:
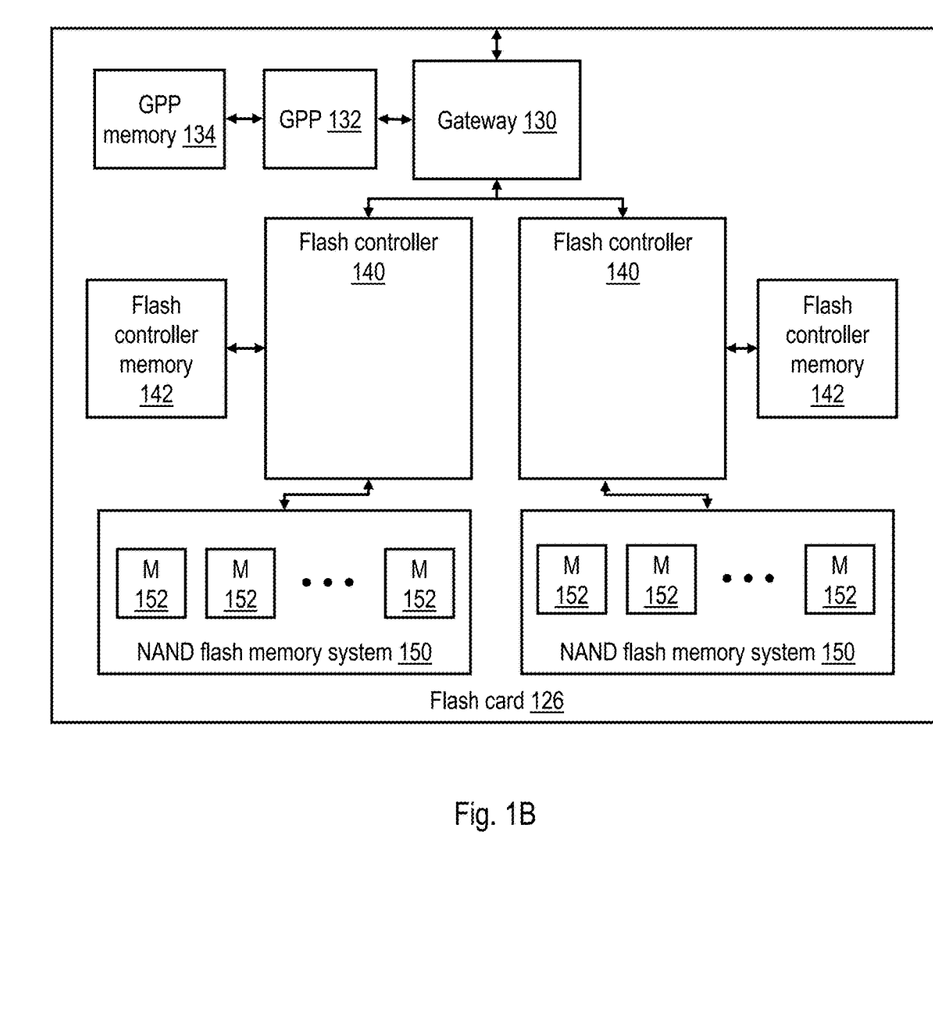
FIG. 1B is a more detailed block diagram of a flash card of the data storage system of FIG. 1A.

FIG. 1B depicts a more detailed block diagram of an exemplary embodiment of a flash card 126 of data storage system 120 of FIG. 1A. Flash card 126 includes a gateway 130 that serves as an interface between flash card 126 and RAID controllers 124. Gateway 130 is coupled to a general-purpose processor (GPP) 132, which can be configured (e.g., by program code) to perform pre-processing on operations received by gateway 130 and/or to schedule servicing of the operations by flash card 126. GPP 132 is coupled to a GPP memory 134 (e.g., Dynamic Random Access Memory (DRAM)) that can conveniently buffer data created, referenced and/or modified by GPP 132 in the course of its processing or data flowing through the gateway 130 destined for one or more of the flash controllers 140.

Gateway 130 is further coupled to multiple flash controllers 140, each of which controls a respective NAND flash memory system 150. Flash controllers 140 can be implemented, for example, by an Application Specific Integrated Circuit (ASIC) and/or a Field Programmable Gate Array (FPGA) and/or a microprocessor, and each have an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive read and write operations from gateway 130 that request to read data stored in NAND flash memory system 150 and/or to store data in NAND flash memory system 150. Flash controllers 140 service these operations, for example, by accessing NAND flash memory system 150 to read or write the requested data from or into NAND flash memory system 150 or by accessing a memory cache (not illustrated) associated with NAND flash memory system 150.

Flash controllers 140 implement a flash translation layer (FTL) that provides logical-to-physical address translation to enable access to specific memory locations within NAND flash memory systems 150. In general, an operation received by flash controller 140 from a host device, such as a processor system 102, contains the logical block address (LBA) at which the data is to be accessed (read or written) and, if a write operation, the write data to be stored to data storage system 120. The operation may also specify the amount (or size) of the data to be accessed. Other information may also be communicated depending on the protocol and features supported by data storage system 120. The flash translation layer translates LBAs received from a RAID controller 124 into physical addresses assigned to corresponding physical location in NAND flash memory systems 150. Flash controllers 140 may perform address translation and/or store mappings between logical and physical addresses in a logical-to-physical translation data structure, such as a logical-to-physical translation table (LPT), which may conveniently be stored in flash controller memory 142.

NAND flash memory systems 150 may take many forms in various embodiments. In the embodiment shown in FIG. 1B, each NAND flash memory system 150 includes multiple (e.g., 32) individually addressable NAND flash memory storage devices 152. In the illustrated example, the flash memory storage devices 152 take the form of a board-mounted flash memory modules, for example, Multi-Level Cell (MLC), Three Level Cell (TLC), or Quad Level Cell (QLC) 3D NAND flash memory modules. The effective storage capacity provided by flash memory storage devices 152 can be increased through the implementation of data compression, for example, by flash controllers 140 and/or high level controllers, such as GPPs 132, RAID controllers 124 or SMCs 123.

Figure 2:
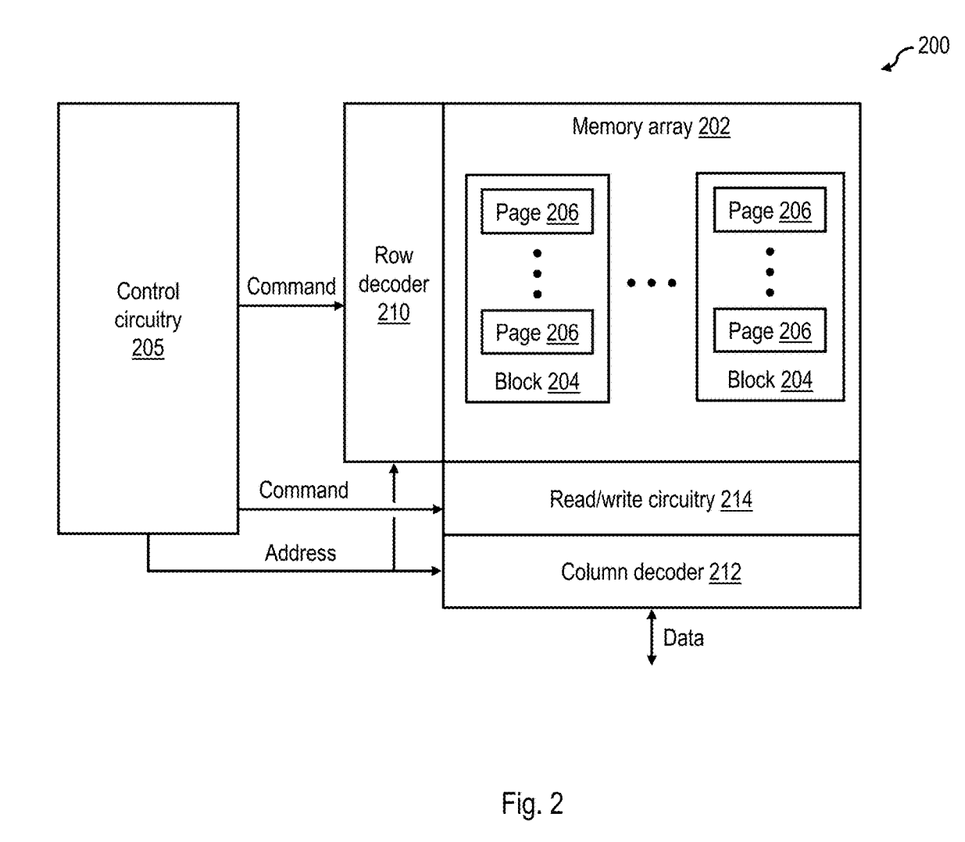
FIG. 2 depicts an exemplary NAND flash memory module in accordance with one embodiment.

Referring now to FIG. 2, there is depicted a block diagram of an exemplary flash memory module 200 that can be utilized to implement any of the NAND flash memory storage devices 152 of FIG. 1B. Flash memory module 200 includes one or more memory die, each implementing at least one memory array 202, for example, formed of a 3D NAND flash memory cells. As indicated in FIG. 2, the memory cells within memory array 202 are physically arranged in multiple blocks 204, each in turn including multiple physical pages 206.

As is known to those skilled in the art, NAND flash memory, such as that employed in memory array 202, must be erased prior to being programmed. Further, NAND flash memory can be (but is not required to be) constrained by its construction such that the smallest granule of storage that can be erased is a block 204 and the smallest granule of storage that can be accessed by a read or write operation is fixed at the size of a single physical page 206. It should be appreciated in this regard that the LBAs provided by host devices correspond to logical pages within a logical address space, where each logical page typically has a size of 4 kilobytes (kB). Physical pages 206, in contrast, typically have a larger size, for example, 16 kB, and can thus correspond to multiple logical pages.

Flash memory module 200 further includes a row decoder 210 through which word lines of memory array 202 can be addressed and a column decoder 212 through which bit lines of memory array 202 can be addressed. In addition, flash memory module 200 includes read/write circuitry 214 that enables the memory cells of a physical page 206 to be programmed or read in parallel. Flash controller 200 additionally includes control circuitry 205 that provides chip-level control of operation of memory array 202, including read and write accesses made to physical pages 206 in memory array 202, erasure of blocks 204, and the amplitude, duration and polarity of related voltages applied to memory array 202.

Having described the general physical structure of one exemplary embodiment of a data storage system 120, certain operational aspects of data storage system 120 are now described with reference to FIG. 3, which is a high level flow diagram of the flash management functions and data structures employed by a GPP 132 and/or flash controller 140 in accordance with one embodiment.

Data storage system 120 does not generally allow external devices (e.g., hosts) to directly address and/or access the physical memory locations within NAND flash memory systems 150. Instead, data storage system 120 is generally configured to present to host devices one or more logical volumes each having a contiguous logical address space, thus allowing host devices to read and write data to and from logical block addresses (LBAs) within the logical address space while permitting one or more of the various levels of controllers (e.g., system management controller 123, RAID controllers 124, flash controllers 140 and GPP 132) to control where the data that is associated with the various LBAs actually resides in the physical memory locations comprising NAND flash memory systems 150. In this manner, performance and longevity of NAND flash memory systems 150 can be intelligently managed and optimized. In the illustrated embodiment, each flash controller 140 performs logical-to-physical address translation for an associated set of LBAs using a logical-to-physical address translation data structure, such as logical-to-physical translation (LPT) table 300, which can be stored, for example, in the associated flash controller memory 142. It should be noted that the logical address supplied to flash controller(s) 140 may be different from the logical address originally supplied to data storage system 120, since various components within data storage system 120 may perform address translation operations between the external devices and the flash controller(s) 140.

Flash management code running on the GPP 132 tracks erased blocks of NAND flash memory system 150 that are ready to be used in ready-to-use (RTU) queues 306, which may be stored, for example, in GPP memory 134. In the depicted embodiment, flash management code running on the GPP 132 maintains one RTU queue 306 per channel (i.e., per data bus), and an identifier of each erased block that is to be reused is enqueued in the RTU queue 306 corresponding to its channel. A build block stripes function 320 performed by flash management code running on the GPP 132 constructs new block stripes for storing data and associated parity information from the erased blocks enqueued in RTU queues 306. The new block stripes are then queued to the flash controller 140 for data placement. Block stripes are preferably formed of blocks residing in different channels, meaning that build block stripes function 320 can conveniently construct a block stripe by drawing each block of the new block stripe from a different RTU queue 306. In general, build block stripes function 320 attempts to construct stripes from blocks of approximately equal health (i.e., expected remaining useful life).

In response to write operation received from a host, such as a processor system 102, a data placement function 310 of flash controller 140 determines by reference to LPT table 300 whether the target LBA(s) indicated in the write request is/are currently mapped to physical memory page(s) in NAND flash memory system 150 and, if so, changes the status of each data page currently associated with a target LBA to indicate that the associated data is no longer valid. In addition, data placement function 310 allocates a page stripe if necessary to store the write data of the write operation and any non-updated data (i.e., for write requests smaller than a logical page, the remaining valid data from a previous write to the same logical address which is not being overwritten and which must be handled in a read-modify-write manner) from an existing page stripe, if any, targeted by the write operation, and/or stores the write data of the write operation and any non-updated (i.e., still valid) data from an existing page stripe, if any, targeted by the write operation to an already allocated page stripe which has free space left. The page stripe may be allocated from either a block stripe already allocated to hold data or from a new block stripe built by build block stripes function 320. In a preferred embodiment, the page stripe allocation can be based on the health of the blocks available for allocation and the "heat" (i.e., estimated or measured write access frequency) of the LBA of the write data. Data placement function 310 then writes the write data, associated metadata (e.g., cyclic redundancy code (CRC) and error correcting code (ECC) values), and parity information for the page stripe in the allocated page stripe. Flash controller 140 also updates LPT table 300 to associate the physical page(s) utilized to store the write data with the LBA(s) indicated by the host device. Thereafter, flash controller 140 can access the data to service host read operations by reference to LPT table 300 as further illustrated in FIG. 3.

Once all pages in a block stripe have been written, flash controller 140 places the block stripe into one of occupied block queues 302, which flash management code running on the GPP 132 utilizes to facilitate garbage collection. As noted above, through the write process, pages are invalidated, and therefore portions of the NAND flash memory system 150 become unused. The associated flash controller 140 (and/or GPP 132) eventually needs to reclaim this space through garbage collection performed by a garbage collector 312. Garbage collector 312 selects particular block stripes for garbage collection based on a number of factors including, for example, the health of the blocks 204 within the block stripes and how much of the data within the erase blocks 204 is invalid. In the illustrated example, garbage collection is performed on entire block stripes, and flash management code running on GPP 132 logs the block stripes ready to be recycled in a relocation queue 304, which can conveniently be implemented in the associated flash controller memory 142 or GPP memory 134.

The flash management functions performed by GPP 132 or flash controller 140 additionally include a relocation function 314 that relocates the data held in block stripes enqueued in relocation queue 304. To relocate such data, relocation function 314 updates LPT table 300 to remove the current association between the logical and physical addresses of the data. In addition, relocation function 314 issues relocation write requests to data placement function 310 to request that the valid data of the old block stripe be written to a new block stripe in NAND flash memory system 150. Once all remaining valid data has been moved from the old block stripe, the old block stripe is passed to dissolve block stripes function 316, which decomposes the old block stripe into its constituent blocks 204, thus disassociating the blocks 204. Each of the blocks 204 formerly forming the dissolved block stripe is then erased under the direction of flash controller 140 and/or the control circuitry 205 of the relevant flash memory module 200, and a corresponding program/erase (P/E) cycle count 334 for each erased block is incremented. Based on the health metrics of each erased block 204 (e.g., bit error rate (BER) metrics, uncorrectable errors, P/E cycle count, etc.), each erased block 204 is either retired (i.e., withdrawn from use) by a block retirement function 318 among the flash management functions executed on GPP 132, or alternatively, prepared for reuse by placing the block 204 on the appropriate ready-to-use (RTU) queue 306 in the associated GPP memory 134.

Figure 3:
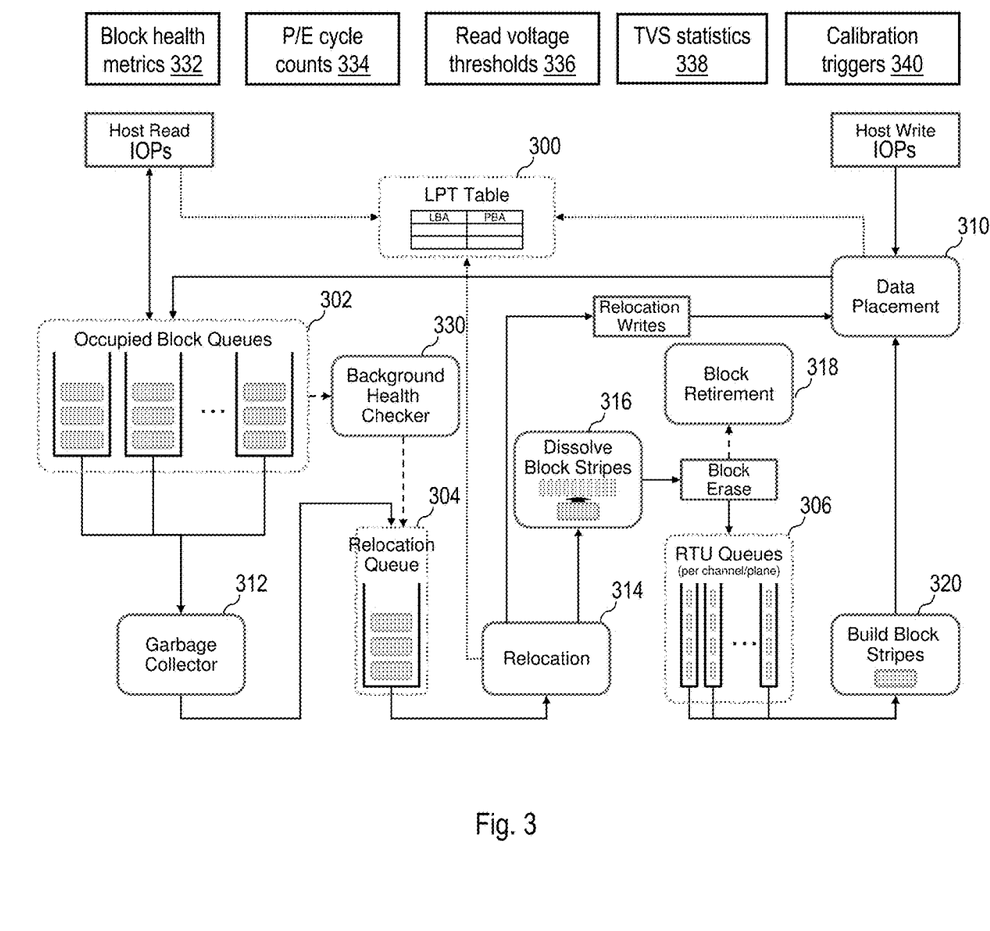
FIG. 3 is a high level flow diagram of the flash management functions and data structures employed in flash management in accordance with one embodiment.

As further shown in FIG. 3, the flash management functions executed on GPP 132 and/or flash controller 140 additionally include a background health checker 330. Background health checker 330, which operates independently of the read and write operations of hosts such as processor systems 102, continuously determines one or more block health metrics 332 for blocks belonging to block stripes recorded in occupied block queues 302. Based on the one or more of the block health metrics 332, background health checker 330 places block stripes on relocation queue 304 for handling by relocation function 314. Key block health metrics 332 preferably monitored and recorded by background health checker relate to the bit error rate (BER) metrics observed for valid blocks and physical pages, and may include, for example, the worst page BER of each block, the mean page BER of each block, the rates of change of the worst page BER and mean page BER of each block, etc. In order to obtain the most accurate health estimate possible, health can be determined from an analysis of valid and invalid data, thereby ensuring that blocks containing almost entirely invalid data are fully analyzed to determine overall block health.

As described in greater detail below, one function of GPP 132 and/or flash controller 140 that can be incorporated within background health checker 330 or that can be separately implemented is the periodic adaptation of read voltage thresholds 336 utilized to decode the data bits stored within the memory cells of memory arrays 202. These read voltage thresholds 336, which can be individually defined to any desired level of granularity (e.g., per-page, per page group within a block, per block, etc.), are preferably selected to improve one or more bit error metrics for the data contained in the memory granules. As further depicted in FIG. 3, GPP 132 and/or flash controller 140 preferably track additional TVS statistics 338 to facilitate intelligent adaptation of read voltage thresholds 336. TVS statistics 338 can include read counts indicating a number of times a given memory unit (e.g., page, page group, and/or block) has been read since being programmed, an interval since an immediately previous read to a given memory unit (e.g., block), a number of consecutive block erases to a same plane without an intervening read, etc. In addition, GPP 132 and/or flash controller 140 can maintain calibration triggers 340, such as per-memory unit counters indicating an elapsed amount of time since read voltage thresholds of that memory unit were adapted and/or per-block counters indicating a number of program/erase cycles that each block has been subjected to since the read voltage thresholds for that block were last adapted.

Figure 4A:
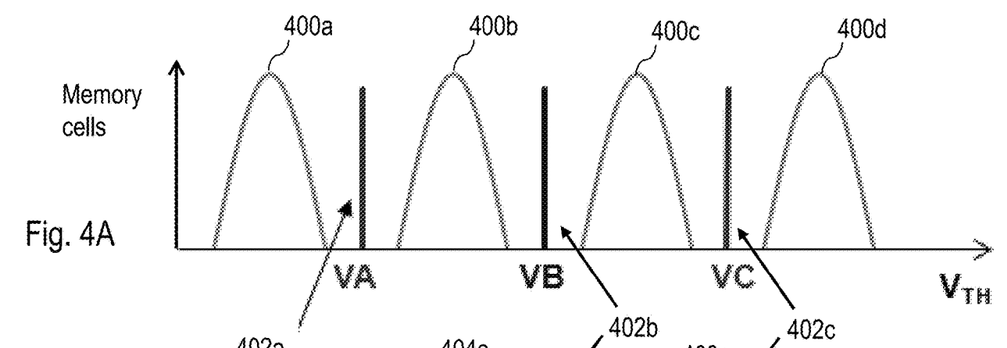
FIGS. 4A-4B depict initial and subsequent programmed threshold voltage distributions for an exemplary multi-level cell (MLC) NAND flash memory.
Figure 4B:
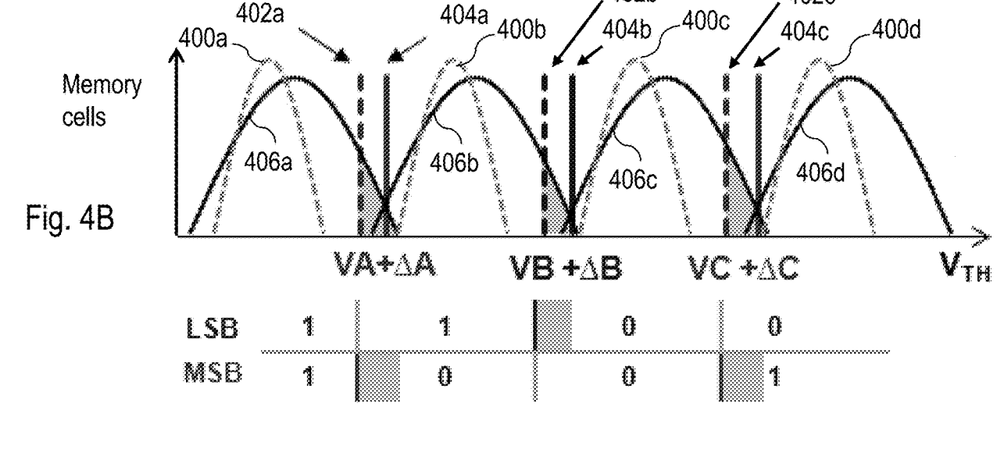

Referring now to FIGS. 4A-4B, there is depicted initial and subsequent programmed threshold voltage distributions ($V_{TH}$) for an exemplary multi-level cell (MLC) NAND flash memory. Those skilled in the art will appreciate that the concepts explained herein with reference to FIGS. 4A-4B can be easily extended to triple-level cells (TLC) or quad-level cells (QLC) NAND flash.

As shown in FIG. 4A, when a block 204 of a NAND flash memory storage device 152 is first put into service, each of the four voltage distributions 400a, 400b, 400c and 400d, respectively representing bit values 11, 10, 00 and 01, is tight and well defined. Consequently, the bit values of the various memory cells can be decoded with little or no error by application of initial read voltage thresholds VA 402a, VB 402b and VC 402c.

Through use, the memory cells within block 204 will be damaged by, among other things, the voltage stress associated with program/erase (P/E) cycling and will be affected by temporary effects such as retention or read disturbs. As a result of this damage and temporary effects, the distribution of memory cell voltages will no longer reflect the tight distributions shown in FIG. 4A, but will instead be characterized by broader and/or shifted voltage distributions 406a, 406b, 406c, 406d shown in FIG. 4B. Because of the degradation of the voltage distributions, bit values can be erroneously decoded if read voltage thresholds VA 402a, VB 402b and VC 402c continue to be applied, and the bit error rate (BER) for reads to the block will consequently increase.

To reduce the BER for reads to the block, GPP 132 and/or flash controller 140 periodically adapts the read voltage thresholds for one or more individual memory units (e.g., a page, page groups and/or a block) either negatively (not illustrated) or positively (as shown explicitly in FIG. 4B). For example, in FIG. 4B each of the read voltage thresholds is shifted positively from a respective one of initial read voltage thresholds VA 402a, VB 402b, and VC 402c by an individually determined threshold voltage shift ΔA, ΔB or ΔC that is selected to reduce and/or minimize the BER. Thus, in the example of FIG. 4B, initial read voltage thresholds VA 402a, VB 402b and VC 402c are replaced by new read voltage thresholds VA+ΔA 404a, VB+ΔB 404b and VC+ΔC 404c, respectively. As described below, the signs and magnitudes of the threshold voltage shifts (TVSs) of the read voltage thresholds selected by GPP 132 and/or flash controller 140 for a memory unit can vary over the lifetime of the memory unit.

In one embodiment, each TVS value can be expressed as the sum of two components, namely, a base TVS that reflects a longer lasting shift in the read threshold voltage and a ΔTVS indicating a more transient shift in the read threshold voltage. For example, in one embodiment, ΔTVS is reset upon erasure of the associated block, while the base TVS is unaffected by block erasures. Further, in some embodiments, the base TVS is selected based at least in part on an operating state of a unit of memory, thus reflecting whether the memory unit is subject to long data retention, read disturb effects, etc. In various implementations, TVS values can be tracked at differing levels of granularity, such as per-page, per-page group (i.e., one or more physical pages, but less than an entire block), and/or per-block. Optimally, read voltage thresholds 336 would include a respective set of TVS values for every physical page of flash memory. However, to reduce the amount of metadata that is required to be stored, physical pages having similar TVS values or characteristics may be managed jointly in at least one embodiment. For example, in one preferred embodiment, the TVS values may be determined and applied on a per-page group basis, where pages are grouped according to flash characterization data and/or the known internal architecture of the memory blocks. The number of page groups and the membership of pages in the various page groups may be fixed or variable for particular types of flash devices. Further, in at least some embodiments, the components of the overall TVS can be determined over differing sizes of memory granules. For example, in one embodiment, the base TVS values may be determined and applied per-page group, while the ΔTVS values may be determined and applied per block.

As noted above with reference to FIG. 3, a controller of a flash card 126 (e.g., GPP 132 and/or flash controller 140) periodically checks the health of its flash memory via the operation of a background health checker 330, which may perform a variety of health check functions, such as read scrubbing to determine if data stored in the flash memory is still readable and block calibration to determine optimal TVS values. Background health checker 330 preferably traverses the entire occupied flash space within a well-defined time interval. However, in some embodiments full TVS calibration is not required to be executed on every background health check iteration. For example, to reduce the read workload, background health checker 330 may perform calibration only every 2-3 background health check iterations, unless a block is explicitly marked for an on-demand calibration by a user or by another management process.

Besides these periodic calibrations, background health checker 330 further occasionally calibrates the TVS value(s) for a block shortly after the block has been written and while the new value has experienced no more than a small number of reads. By occasionally, what is meant is when the characteristics of the block have significantly changed due to permanent cell damage. By shortly, what is meant is within a reasonable amount of time after the writing, without interfering with host read and write operations targeting the block. Therefore, if the calibration can be performed immediately after the writing when the programmed values have reached a stable state, then it preferably is. Depending on TVS statistics 338 and/or block health metrics 332 of the block, these calibrations adapt the base TVS values. Otherwise, calibration is performed at a first available time after the block is written that would not unduly delay normal host operations.

Figure 5:
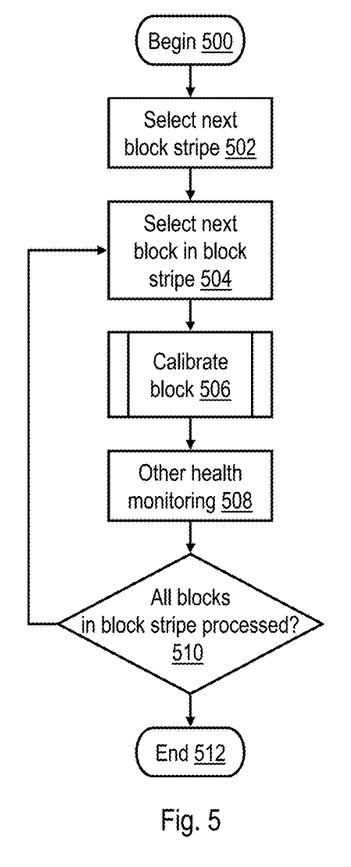
FIG. 5 is a high level logical flowchart of an exemplary background health check process in accordance with one embodiment.

With reference now to FIG. 5, there is illustrated an exemplary high level logical flowchart of an exemplary background health check process in accordance with one embodiment. The process can be performed, for example, by background health checker 330 on an iterative basis.

The process of FIG. 5 begins at block 500 and then proceeds to block 502, which depicts background health checker 330 selecting a next block stripe for processing from occupied block queue 302. In general, any block stripe may be chosen, and the selection may be based on one or more criteria, such as order, elapsed time since last programming, elapsed time since last read access, etc. At block 504, background health checker 330 additionally selects a first (or next) block for processing in the selected block stripe. Again, the selection may be based on one or more criteria, such as order, elapsed time since last programming, elapsed time since last read access, etc. Background health checker 330 then calibrates the TVSs for the read threshold voltage (s) of the physical pages (or page groups) within the selected block, as illustrated at block 506. Further details regarding this calibration are given below with reference to FIG. 6. As indicated at block 508, background health checker 330 may optionally additionally perform other health monitoring functions at block 508. For example, in one preferred embodiment, at block 508 background health checker 330 employs BER and/or other metrics gathered from calibration reads performed at block 506 to perform health binning, wear leveling, or other health monitoring functions to reduce monitoring-induced wear and processing overhead. At block 510, background health checker 330 determines whether or not all blocks in the selected block stripe have been processed. If not, the process of FIG. 5 returns to block 504, which has been described. If, however, background health checker 330 determines at block 510 that all blocks in the selected block stripe have been processed, the process of FIG. 5 ends at block 512 until a next iteration of the background health check process. Other embodiments (for example embodiments that do not organize blocks into block stripes) may traverse the blocks in the pool of occupied block queues, block-by-block or any other meaningful order that will be apparent to a person skilled in the art.

Figure 6:
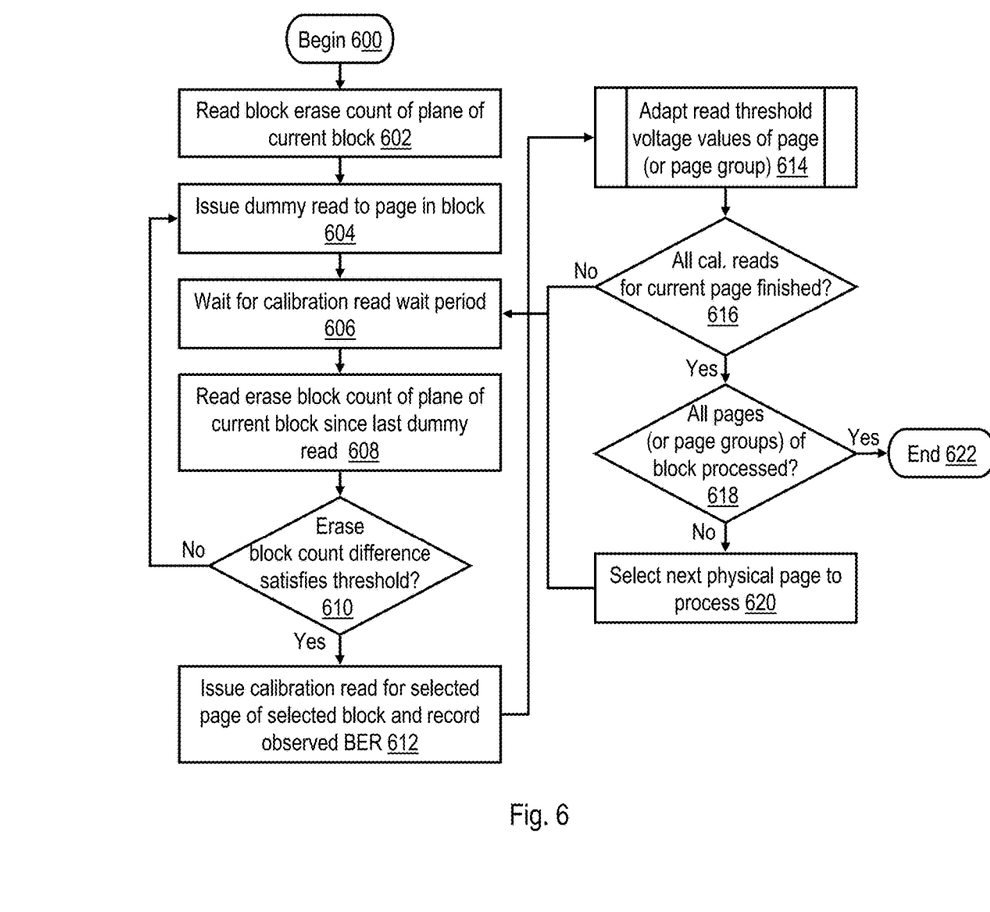
FIG. 6 is a high level logical flowchart of an exemplary calibration process for adapting read voltage thresholds of a non-volatile memory in accordance with one embodiment.

Referring now to FIG. 6, there is depicted a high level logical flowchart of an exemplary calibration process for adapting read voltage thresholds of a non-volatile memory in accordance with one embodiment. The illustrated process can be performed, for example, at block 506 of FIG. 5. Although the illustrated process can be performed by GPP 132 and/or flash controller 140 in various embodiments (which can individually or collectively be referred to as a "controller"), in the following description the process will be described as being performed by flash controller 140 for ease of description.

The process of FIG. 6 begins at block 600 and then proceeds to block 602, which illustrates flash controller 140 reading the value of a counter (e.g., maintained in block health metrics 332 or calibration triggers 340) indicating a number of erase operations in the plane containing the currently selected block of memory. This value is referred to as the block erase count. At block 604, flash controller 140 then issues a "dummy" configuration read to a selected physical page of the selected block. As noted above, for 3D NAND flash memory, a read to any physical page of the block can cause a transition of all the physical pages in the block from the FIBS to the LBS in the absence of interference effects from block erases in the same plane. This read is referred to as a "dummy" read in that the data read from the physical page is not used (and is instead discarded). It should further be noted that the BER observed for the physical page during the "dummy" read is not used for calibration or health management purposes since that BER may reflect the temporarily elevated BER of the HBS. In at least some implementations including multi-level NAND flash memory, the "dummy" configuration read may be preferentially directed to a physical page within the selected block that has a degraded bit storage capacity (e.g., from MLC to SLC).

Following the "dummy" configuration read at block 604, flash controller 140 waits at block 606 for a calibration read wait period, which is a time interval long enough for the selected block to stop exhibiting high BER due to reading after programming, but also short enough to avoid data retention effects. In current 3D NAND flash technology, the calibration read wait period is determined by the time it takes to ensure that the block enters the LBS, typically a few seconds or less in duration (e.g., 1 second) and the maximum retention time to not enter the HBS, which is in the order of several minutes. Both can be determined through characterization of the memory device. Note that the calibration read wait may vary within the calibration process for a block within the boundaries explained. For instance, after issuing a dummy read, the calibration read wait period may be set to the minimal waiting time, whereas after finishing a calibration read it may be longer to artificially throttle the calibration. After the calibration read wait period has elapsed, the controller again reads the current block erase count of the plane containing the selected block (block 608) and determines if the difference between the current block erase count and the prior block erase count satisfies (e.g., is less than or equal to) a threshold (block 610). If not, meaning that the plane containing the selected block has incurred sufficient erase cycles since the last read to the selected block to return the block to the FIBS, the process of FIG. 6 returns to block 604 and following blocks, and flash controller 140 again issues a "dummy" configuration read before proceeding in order to guarantee that the block (and all physical pages therein) have returned to the LBS. Otherwise, flash controller 140 issues a calibration read for a selected physical page of the selected block (block 612) while the selected physical page is in the LBS and records the BER observed for the selected physical page. Utilizing the BER observed for the selected physical page while in the LBS, flash controller 140 adapts the TVS values of the physical page (or the page group including the selected physical page) (block 614). One exemplary embodiment of a process for adapting the TVS values of the selected physical page is described below with reference to FIG. 7.

As indicated at block 616, flash controller 140 may issue multiple calibration reads for the selected page in the course of determining the optimal TVS values for the physical page (or the page group of which the physical page is a representative member). If flash controller 140 determines at block 616 that all calibration reads to the currently selected page have been completed, the process proceeds to block 618. If, however, flash controller 140 determines at block 616 that at least one additional calibration read of the selected physical page is to be performed, the process of FIG. 6 returns to block 606 and following blocks, which have been described. Thus, flash controller 140 waits for at least one calibration read wait period between each calibration read to ensure that the selected physical page is in the LBS for each calibration read.

At block 618, flash controller 140 determines whether or not all physical pages (or in the case in which TVS values are adapted per-page group, all page groups) have been processed. If so, the process of FIG. 6 ends at block 622. If not, flash controller 140 selects a next physical page to process (block 620), and the process of FIG. 6 returns to block 606, which has been described.

Figure 7:
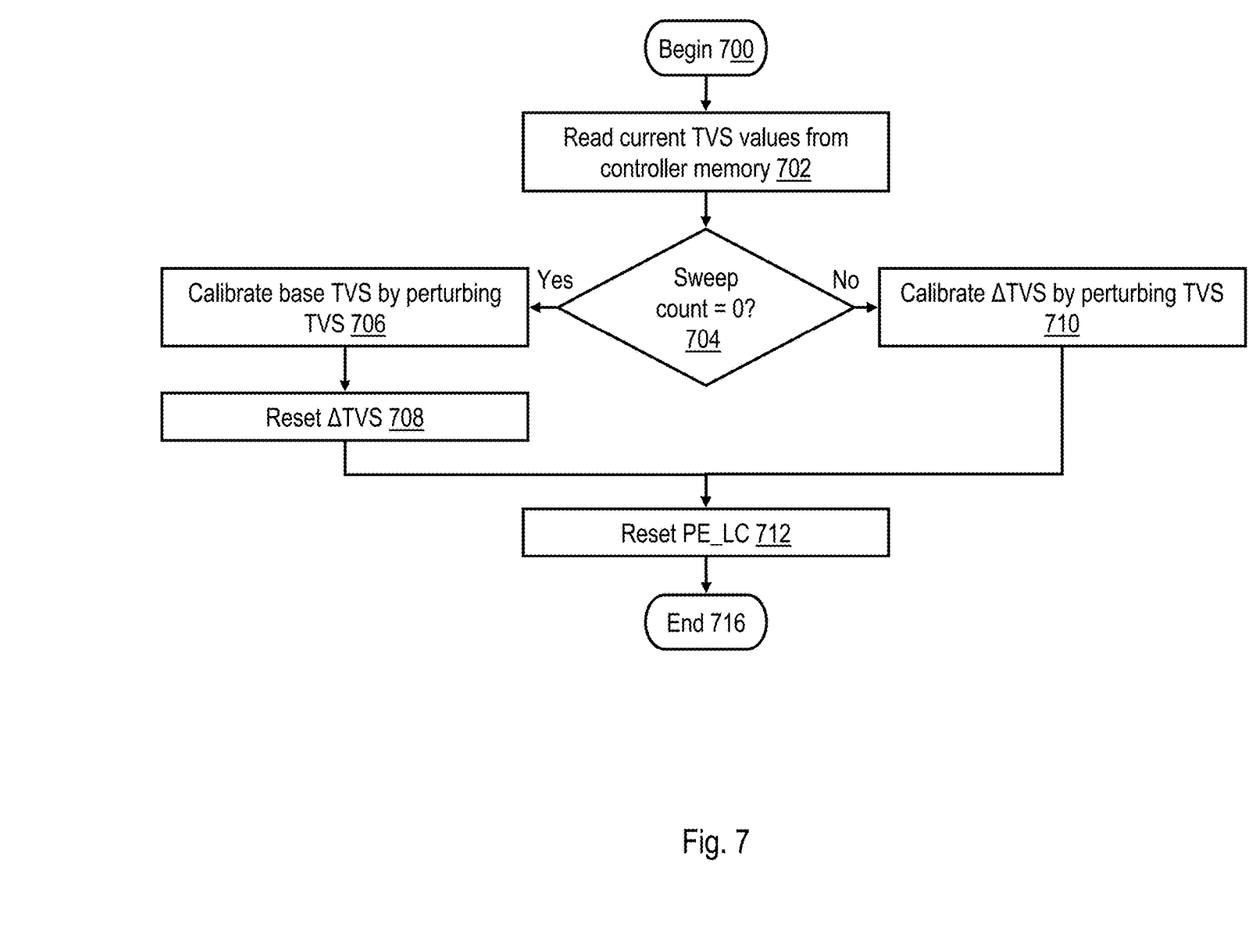
FIG. 7 is a more detailed flowchart of an exemplary process for block calibration that may be employed within the process of FIG. 6.

With reference now to FIG. 7, there is depicted a more detailed flowchart of an exemplary process for block calibration that may be employed within the process of FIG. 6, for example, at block 614. It should be appreciated that in some embodiments, other calibration processes, such as the alternative calibration processes disclosed in U.S. Pat. No. 9,251,909 (which is incorporated herein by reference), may be employed.

The process of FIG. 7 begins at block 700 and then proceeds to block 702, which illustrates flash controller 140 reading at least one current TVS values for the selected physical page (or page group) from read voltage thresholds 336. In addition, at block 704 flash controller 140 determines whether a sweep count associated with the selected physical page (or page group) is zero. The sweep count indicates a number of background health check sweeps that have been performed by background health checker 330 for a particular data granule containing the physical page (e.g., a block stripe) since the data granule was programmed. In alternative embodiments, other metadata such as metadata from TVS statistics 338 and/or block health metrics 332 could be used instead of the sweep count to determine which component of the TVS value should be calibrated. In response to flash controller 140 determining that the sweep count is zero, the process proceeds to block 706; otherwise, the process passes to block 710.

At block 706, flash controller 140 calibrates a base TVS value by perturbing the current TVS value by one or more positive and/or negative voltage increments. (A calibration read is performed at block 612 of FIG. 6 utilizing each voltage increment to be tested.) Flash controller 140 stores the increment providing the lowest BER for the physical page value as the base TVS for the selected physical page (e.g., as part of read voltage thresholds 336). In addition, at block 708 flash controller 140 resets the ΔTVS value for the selected physical page to a nominal initial value, such as zero. The process passes from block 708 to block 712, which is described below.

Referring now to block 710, if flash controller 140 determines at block 704 that the sweep count is zero, flash controller 140 calibrates the ΔTVS value for the selected physical page by perturbing its current ΔTVS value recorded in read voltage thresholds 336. As above, flash controller 140 performs a calibration read at block 612 of FIG. 6 for each positive or negative voltage increment to be tested. Flash controller 140 then stores the increment providing the lowest BER for the physical page value as the ΔTVS for the selected physical page (e.g., as part of read voltage thresholds 336). The process proceeds from block 710 to block 712.

In one preferred embodiment, the number of increments and the range of increments tested at block 706 and/or block 710 varies based on the BER observed for the first calibration read of each physical page. For example, in a simple case, if the BER of the first calibration read, which is performed with the previous value of base TVS and ΔTVS, is less than a threshold, flash controller 140 may perturb the base TVS or ΔTVS with a smaller number of increments and/or a smaller numerical range of increments. Conversely, if the BER of the first calibration read is greater than or equal to the threshold, flash controller 140 may perturb the base TVS or ΔTVS with a larger number of increments and/or a larger numerical range of increments. In this manner, flash controller 140 can dynamically adapt its calibration process to abrupt variations in the BER and thus be able to make implement large overall TVSs, when necessary.

Referring now to block 712, flash controller 140 also preferably resets a counter value indicating a number of program/erase cycles for the selected block since last calibration (i.e., PE_LC) to a selected starting value, such as zero, and updates TVS statistics 338 accordingly. In some alternative embodiments, a block may be marked for later recalibration when the value of PE_LC exceeds a predetermined threshold. In other alternative embodiments, the number of calibrations may be reduced further by postponing calibration of a block when the value of PE_LC is lower than a predetermined threshold. In yet other embodiments, separate counters for the program/erase cycles for the selected block since last base TVS and delta TVS calibration may be maintained. Following block 712, the process of FIG. 7 ends at block 716.

Following calibration of the TVS values of the physical pages of a block, a flash controller 140 employs the TVS values determined by the calibration to read data from the physical pages of the block. In particular, for the described embodiment in which a base TVS value and ΔTVS value are determined, flash controller 140 shifts the read threshold voltages of the physical page from their initial values by the sum of the base TVS value and the ΔTVS value.

As has been described, in at least one embodiment, in response to selection of a block for adaptation of at least one read voltage threshold applicable to a physical page of the block, a controller issues a dummy read operation to the block to ensure the physical page is in a LBS. The controller waits for a calibration read wait period following the dummy read operation and, during the calibration read wait period, monitors for an interfering access to the non-volatile memory that would temporarily place the physical page in a HBS. In response to not detecting the interfering access during the calibration read wait period, the controller performs a calibration read operation for the physical page and adapts at least one read voltage threshold for the physical page based on results (e.g., an observed BER) of the calibration read operation.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude signal media per se, transitory propagating signals per se, and energy per se.

In addition, although embodiments have been described that include use of a NAND flash memory, it should be appreciated that embodiments of the present invention can also be used with any other type of non-volatile random access memory (NVRAM).

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of adapting read voltage thresholds of a physical page in a block of memory in a non-volatile memory, the method comprising:
   in response to selection of the block for adaptation of at least one read voltage threshold applicable to the physical page, the controller issuing a dummy read operation to the block to ensure the physical page is in a lower bit error rate (BER) state;
   the controller waiting for a calibration read wait period following the dummy read operation; and
   the controller thereafter performing a calibration read operation for the physical page and adapting at least one read voltage threshold for the physical page based on results of the calibration read operation.

2. The method of claim 1, wherein:
the method further comprises:
during the calibration read wait period, the controller monitoring for an interfering access to the non-volatile memory that would temporarily place the physical page in a higher BER state; and
performing the calibration read operation includes performing the adapting only in response to the monitoring not detecting the interfering access during the calibration read wait period.

3. The method of claim 2, wherein the monitoring includes monitoring for erase operations directed to a unit of the non-volatile memory including the block.

4. The method of claim 2, wherein the monitoring includes determining if erase operations to a plane of the non-volatile memory containing the block satisfy a threshold.

5. The method of claim 1, wherein the calibration read wait period has a duration of at least a settling time of a write operation and less than a duration at which the physical page would return to the higher BER state due to data retention effects.

6. The method of claim 1, wherein the adapting includes the controller updating at least one threshold voltage shift applicable to read operations to the physical page.

7. The method of claim 6, wherein the adapting includes dynamically selecting a number of candidate threshold voltage shifts to test based on a bit error rate obtained by reading the configuration read operation.

8. A data storage system, comprising:
a controller for a non-volatile memory, wherein the controller is configured to perform:
in response to selection of the block for adaptation of at least one read voltage threshold applicable to the physical page, issuing a dummy read operation to the block to ensure the physical page is in a lower bit error rate (BER) state;
waiting for a calibration read wait period following the dummy read operation; and
thereafter performing a calibration read operation for the physical page and adapting at least one read voltage threshold for the physical page based on results of the calibration read operation.

9. The data storage system of claim 8, wherein the controller is further configured to perform:
during the calibration read wait period, the monitoring for an interfering access to the non-volatile memory that would temporarily place the physical page in a higher BER state; and
performing the adapting only in response to the monitoring not detecting the interfering access during the calibration read wait period.

10. The data storage system of claim 9, wherein the monitoring includes monitoring for erase operations directed to a unit of the non-volatile memory including the block.

11. The data storage system of claim 9, wherein the monitoring includes determining if erase operations to a plane of the non-volatile memory containing the block satisfy a threshold.

12. The data storage system of claim 8, wherein the calibration read wait period has a duration of at least a settling time of a write operation and less than a duration at which the physical page would return to the higher BER state due to data retention effects.

13. The data storage system of claim 8, wherein the adapting includes the controller updating at least one threshold voltage shift applicable to read operations to the physical page.

14. The data storage system of claim 12, wherein the adapting includes dynamically selecting a number of candidate threshold voltage shifts to test based on a bit error rate obtained by reading the configuration read operation.

15. The data storage system of claim 8, and further comprising the non-volatile memory.

16. A computer program product, the computer program product comprising a computer readable storage medium having program instructions embodied therewith, the program instructions executable by a controller to cause the controller to perform:
in response to selection of the block for adaptation of at least one read voltage threshold applicable to the physical page, issuing a dummy read operation to the block to ensure the physical page is in a lower bit error rate (BER) state;
waiting for a calibration read wait period following the dummy read operation; and
thereafter, performing a calibration read operation for the physical page and adapting at least one read voltage threshold for the physical page based on results of the calibration read operation.

17. The computer program product of claim 16, wherein the program instructions further cause the controller to:
during the calibration read wait period, the controller monitoring for an interfering access to the non-volatile memory that would temporarily place the physical page in a higher BER state; and
performing the adapting only in response to the monitoring not detecting the interfering access during the calibration read wait period.

18. The computer program product of claim 17, wherein the monitoring includes monitoring for erase operations directed to a unit of the non-volatile memory including the block.

19. The computer program product of claim 17, wherein the monitoring includes determining if erase operations to a plane of the non-volatile memory containing the block satisfy a threshold.

20. The computer program product of claim 16, wherein the calibration read wait period has a duration of at least a settling time of a write operation and less than a duration at which the physical page would return to the higher BER state due to data retention effects.

* * * * *